United States Patent
Mittal et al.

(10) Patent No.: US 10,348,246 B1
(45) Date of Patent: Jul. 9, 2019

(54) MIXER BIASING WITH BASEBAND FILTER COMMON-MODE VOLTAGE

(71) Applicant: Qualcomm Incorporated, San Diego, CA (US)

(72) Inventors: Ayush Mittal, Bangalore (IN); Krishnaswamy Thiagarajan, Bangalore (IN); Bhushan Shanti Asuri, San Diego, CA (US); Mahim Ranjan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/862,567

(22) Filed: Jan. 4, 2018

(51) Int. Cl.
*H03D 7/12* (2006.01)
*H04B 1/40* (2015.01)

(52) U.S. Cl.
CPC ..... *H03D 7/125* (2013.01); *H03D 2200/0086* (2013.01); *H04B 1/40* (2013.01)

(58) Field of Classification Search
CPC .. H03D 7/12; H03D 7/125; H03D 2200/0066; H03D 2200/0086; H04B 1/40; H04B 1/44
USPC .......................... 327/355, 356, 357
See application file for complete search history.

(56) References Cited

U.S. PATENT DOCUMENTS

| 8,106,712 | B2 | 1/2012 | Lee et al. | |
|---|---|---|---|---|
| 8,754,700 | B1* | 6/2014 | Ro | H03D 7/1491 327/359 |
| 8,847,808 | B1 | 9/2014 | Chi et al. | |
| 9,136,889 | B2 | 9/2015 | Muhammad | |
| 9,154,079 | B2 | 10/2015 | Zhuo et al. | |
| 9,577,576 | B1 | 2/2017 | Brown, Jr. | |
| 2006/0014509 | A1* | 1/2006 | Xu | H03D 7/1441 455/255 |
| 2007/0064833 | A1* | 3/2007 | Sahota | H04B 1/0082 375/295 |
| 2011/0249770 | A1* | 10/2011 | Bellaouar | H03F 1/0261 375/296 |
| 2014/0018028 | A1* | 1/2014 | Lemkin | H03D 7/1441 455/269 |
| 2014/0111252 | A1* | 4/2014 | Zhuo | H03D 7/12 327/109 |

* cited by examiner

*Primary Examiner* — William Hernandez
(74) *Attorney, Agent, or Firm* — Colby Nipper/Qualcomm

(57) ABSTRACT

An apparatus is disclosed for mixer biasing with baseband filter common-mode voltage. In an example aspect, the apparatus includes a mixer, a baseband filter, and a bias circuit. The mixer has a mixer transistor that is coupled to a bias node and a baseband node. The baseband filter is coupled to the mixer via the baseband node. The baseband filter is configured to operate with a common-mode reference voltage that is associated with a common-mode voltage applied at the baseband node. The bias circuit is coupled to the baseband filter and the bias node. The bias circuit is configured to receive the common-mode reference voltage from the baseband filter and generate, at the bias node, a bias voltage for biasing the mixer transistor based on the common-mode reference voltage.

24 Claims, 7 Drawing Sheets

700

Communicate a common-mode voltage between a baseband filter and a mixer via a baseband node, the common-mode voltage associated with a baseband signal, the mixer including a mixer transistor coupled to the baseband node
702

Generate a bias voltage based on the common-mode voltage
704

Bias the mixer transistor using the bias voltage that is based on the common-mode voltage
706

FIG. 7

MIXER BIASING WITH BASEBAND FILTER COMMON-MODE VOLTAGE

TECHNICAL FIELD

This disclosure relates generally to radio-frequency devices and, more specifically, to biasing mixers based on baseband filter common-mode voltage to reduce harmonic distortion and conversion loss in mixers.

BACKGROUND

Electronic devices use radio-frequency (RF) signals to communicate information. These radio-frequency signals enable users to talk with friends, download information, share pictures, remotely control household devices, receive global positioning information, employ radar for detection and tracking, or listen to radio stations. While radio-frequency signals can reliably carry information over long distances, extracting information directly from the radio-frequency signals and enabling the electronic device to support multiple different radio-frequency bands is challenging. To address these issues, mixers are used for frequency conversion.

As part of transmitting or receiving a signal, the mixer converts a signal from a low frequency to a high frequency or vice versa. In transmitters, the mixer upconverts a baseband signal to a radio-frequency signal. In receivers, the mixer downconverts a radio-frequency signal to a baseband signal. Through frequency conversion, the mixer enables the electronic device to process communication signals at the lower baseband frequency and also enables the same baseband frequency to be used for different radio-frequency bands.

Generally, mixers use transistors to perform the frequency conversion. One of the challenges in designing mixers involves direct current (DC) biasing of these transistors. Several factors can impact the value of a bias voltage, including variations in temperature, supply voltage, ground voltage, and input signal voltages. Without proper biasing, these transistors can increase harmonic distortion and conversion loss in the mixer, which degrades communication performance of the electronic device.

SUMMARY

An apparatus is disclosed that implements mixer biasing with baseband filter common-mode voltage as a reference. Biasing based on the baseband filter common-mode voltage enables a bias voltage to track changes in a baseband signal's voltage and be substantially independent of variations in supply and ground voltages. The bias voltage can further be tuned to account for other variations, including different operational modes and process variations. Providing an appropriate bias voltage for biasing transistors in the mixer improves communication performance in electronic devices.

In an example aspect, an apparatus is disclosed. The apparatus includes a mixer, a baseband filter, and a bias circuit. The mixer has a mixer transistor that is coupled to a bias node and a baseband node. The baseband filter is coupled to the mixer via the baseband node. The baseband filter is configured to operate with a common-mode reference voltage that is associated with a common-mode voltage applied at the baseband node. The bias circuit is coupled to the baseband filter and the bias node. The bias circuit is configured to receive the common-mode reference voltage from the baseband filter and generate, at the bias node, a bias voltage for biasing the mixer transistor based on the common-mode reference voltage.

In an example aspect, an apparatus is disclosed. The apparatus includes a mixer and a baseband filter. The mixer has a mixer transistor coupled to a bias node and a baseband node. The baseband filter is coupled to the mixer via the baseband node and is configured to operate with a common-mode reference voltage that is associated with a common-mode voltage applied at the baseband node. The apparatus also includes means for generating a bias voltage for biasing the mixer transistor based on the common-mode reference voltage. The means for generating is coupled to the baseband filter and the bias node. The means for generating is configured to provide the bias voltage to the bias node.

In an example aspect, a method for mixer biasing with baseband filter common-mode voltage is disclosed. The method includes communicating a common-mode voltage between a baseband filter and a mixer via a baseband node, the common-mode voltage associated with a baseband signal. The mixer includes a mixer transistor coupled to the baseband node. The method also includes generating a bias voltage based on the common-mode voltage. The method additionally includes biasing the mixer transistor using the bias voltage that is based on the common-mode voltage.

In an example aspect, an apparatus is disclosed. The apparatus includes a mixer, a voltage tracker circuit, and a voltage tuner circuit. The mixer has a bias node and a mixer transistor. A terminal of the mixer transistor is coupled to the bias node. The voltage tracker circuit has an input node and an intermediate node. The voltage tracker circuit includes a resistor and a diode-connected transistor. The diode-connected transistor has a source coupled to the input node and a drain coupled to the resistor. The diode-connected transistor and the resistor are coupled together in series between the input node and the intermediate node. The voltage tuner circuit is coupled between the intermediate node and the bias node. The voltage tuner circuit includes at least one programmable resistor coupled between the intermediate node and the bias node. The voltage tracker circuit and the voltage tuning circuit are jointly configured to generate a bias voltage at the bias node that biases the mixer transistor, with the bias voltage dependent upon a common-mode reference voltage received at the input node.

BRIEF DESCRIPTION OF DRAWINGS

FIG. 7 illustrates a flow diagram illustrating an example process for mixer biasing with baseband filter common-mode voltage.

DETAILED DESCRIPTION

Electronic devices use mixers to support radio-frequency communications. Mixers typically include transistors that perform frequency conversion between a radio frequency and a baseband frequency. Some mixer biasing techniques generate a bias voltage that is dependent upon a supply voltage or a ground voltage to bias the transistors in the mixers. However, the supply voltage or the ground voltage can vary, thereby causing the transistors to become wrongly biased. Improper biasing can cause the transistors to behave non-linearly, leading to increased harmonic distortion. Additionally, improper biasing can increase conversion loss, thereby decreasing power efficiency of the electronic device.

In contrast, example approaches are described herein for mixer biasing using a baseband filter common-mode voltage. Dependency on the baseband filter common-mode voltage enables the mixer biasing to be substantially independent of variations in the power supply and the ground voltage, and further achieves biasing for variable baseband filter common-mode voltages, as described in further detail below. The bias voltage can further be tuned to account for other variations, including different operational modes and process variations. As a result, desired bias voltages are achievable over a variety of different circumstances, which improves performance of the mixer.

Figure 1:
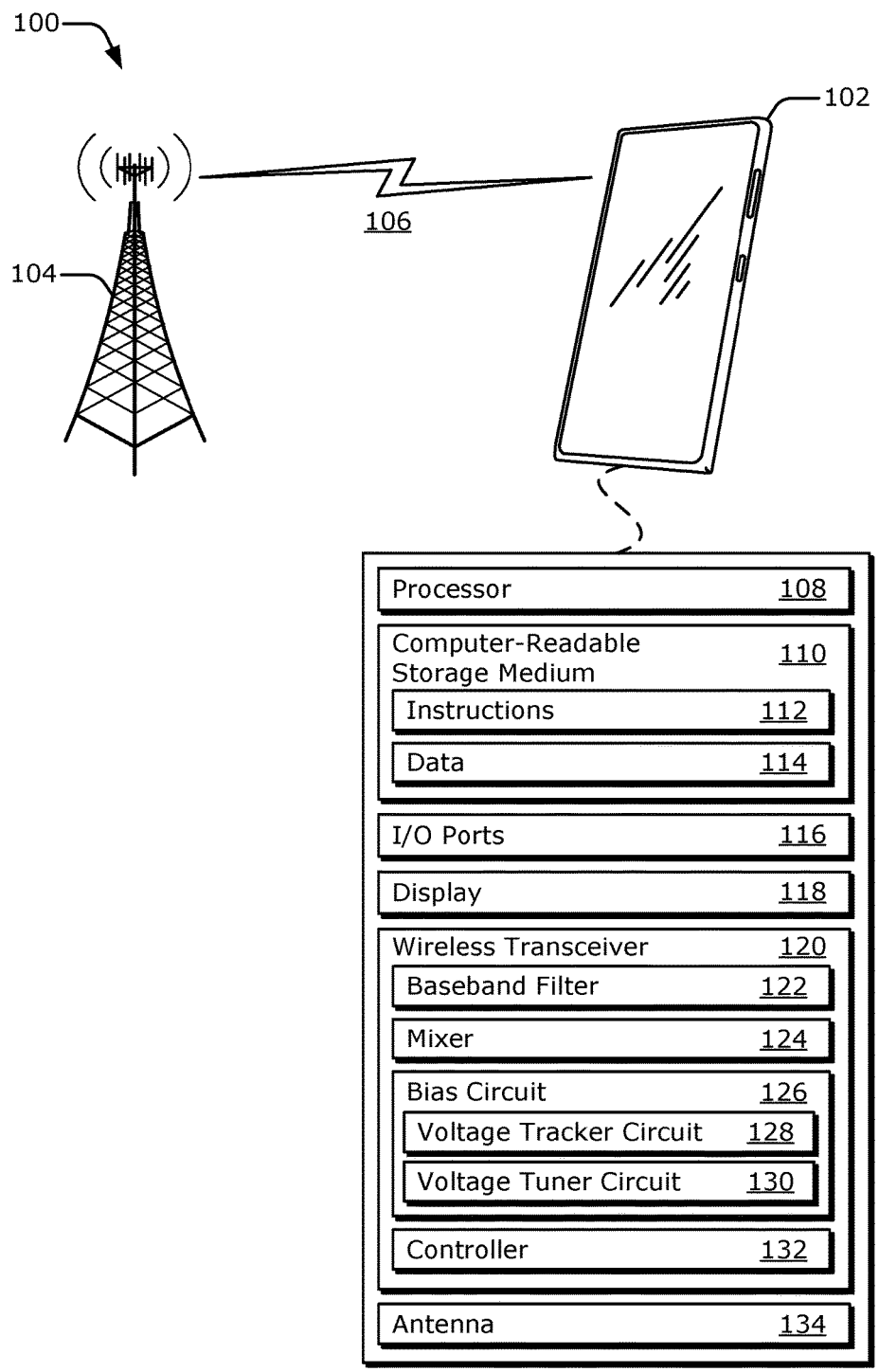
FIG. 1 illustrates an example environment for mixer biasing with baseband filter common-mode voltage.

FIG. 1 illustrates an example environment 100 for mixer biasing with baseband filter common-mode voltage. In the example environment 100, a computing device 102 communicates with a base station 104 through a wireless communication link 106 (wireless link 106). In this example, the computing device 102 is implemented as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, radar, radio, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102 and an uplink of other data or control information communicated from the computing device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

The computing device 102 includes a processor 108 and a computer-readable storage medium 110 (CRM 110). The processor 108 may include any type of processor, such as an application processor or multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith.

The wireless transceiver 120 includes circuitry and logic for transmitting and receiving communication signals via an antenna 134. Components of the wireless transceiver 120 can include amplifiers, switches, analog-to-digital converters, radio-frequency (RF) filters, and so forth for conditioning the communication signals. The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate transmit and receiver chains). In general, the wireless transceiver 120 processes data and/or signals associated with communicating data of the computing device 102 over the antenna 134.

As shown, the wireless transceiver 120 includes at least one baseband filter 122, at least one mixer 124, at least one bias circuit 126, and at least one controller 132. The bias circuit 126 includes at least one voltage tracker circuit 128 and at least one voltage tuner circuit 130, both of which are described in further detail with respect to FIGS. 4-6. The baseband filter 122, the mixer 124, the bias circuit 126, and the controller 132 can at least partially implement mixer biasing with baseband filter common-mode voltage, as described with reference to FIG. 2.

Figure 2:
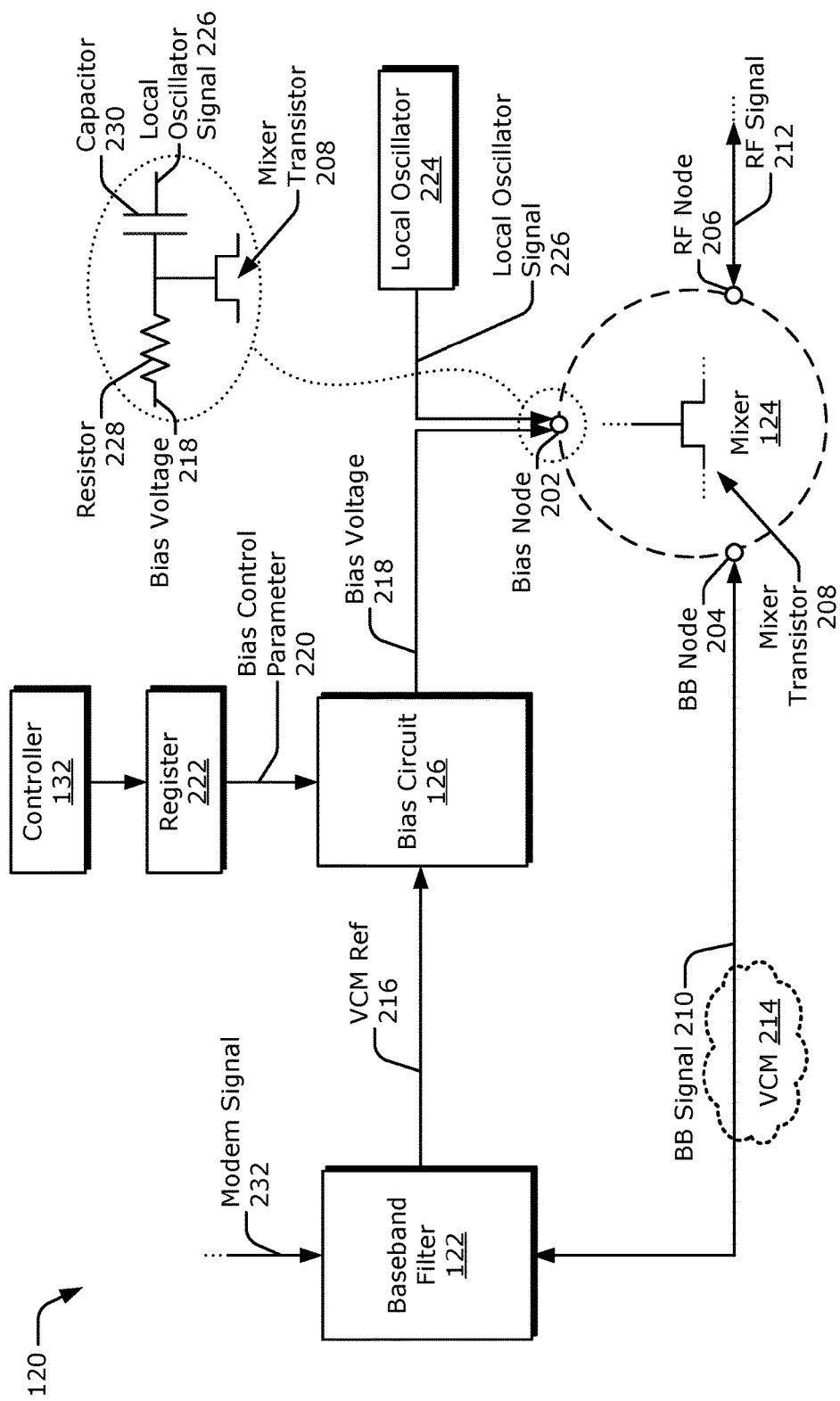
FIG. 2 illustrates an example implementation of a wireless transceiver for mixer biasing with baseband filter common-mode voltage.

FIG. 2 illustrates an example implementation of the wireless transceiver 120 for mixer biasing with baseband filter common-mode voltage. The mixer 124 includes at least one bias node 202, at least one baseband node 204 (BB Node 204), and at least one radio-frequency node 206 (RF Node 206). The bias node 202 couples the mixer 124 to the bias circuit 126, and the baseband node 204 couples the mixer 124 to the baseband filter 122. The radio-frequency node 206 couples the mixer to other components of the wireless transceiver 120, such as a radio-frequency filter or an amplifier leading to or from the antenna 134 (of FIG. 1). The mixer 124 upconverts a baseband signal 210 (BB Signal 210) to a radio-frequency signal 212 (RF Signal 212) or downconverts the radio-frequency signal 212 to the baseband signal 210. The mixer 124 is implemented using at least one mixer transistor 208, making performance of the mixer 124 dependent upon appropriate biasing of the mixer transistor 208.

The at least one mixer transistor 208 can be implemented using field effect transistors (FETs), such as metal-oxide-semiconductor field-effect transistors (MOSFETs) or junction field-effect transistors (JFETs), bipolar junction transistors (BJTs), insulated gate bipolar transistors (IGBTs), and so forth. In some implementations, the mixer transistor 208 acts as a switch driven by a local oscillator 224 via a local oscillator signal 226. The local oscillator 224 operates at a frequency that supports the upconversion or the downconversion.

The baseband filter 122 can be implemented by a variety of different filters, including surface acoustic wave (SAW) filters, bulk acoustic wave (BAW) filters, mechanical filters, crystal filters, ceramic filters, lumped-element filters, and so forth. The baseband filter 122 may act as a low-pass, band-pass, or high-pass filter. Within a transmit path of the wireless transceiver 120, the baseband filter 122 accepts a signal from another component, such as a modem signal 232 from a modem (not shown in FIG. 2). The baseband filter 122 filters the modem signal 232 to produce the baseband signal 210, which is provided to the mixer 124 for upconversion. Within a receive path, the baseband filter 122 accepts and filters the baseband signal 210 that is provided by the mixer 124 as a result of down-converting the radio frequency signal 212.

Whether produced by the baseband filter 122 for upconversion or by the mixer 124 from down-conversion, the baseband signal 210 is associated with a common-mode voltage 214 (VCM 214). The common-mode voltage 214 is a DC voltage that provides a DC level at the baseband node 204. In general, the baseband signal 210 and the common-mode voltage 214 are applied to a terminal of the mixer transistor 208 via the baseband node 204. The mixer 124 and the baseband filter 122 communicate the baseband signal 210 and the accompanying common-mode voltage 214 between each other. Communicating can refer to the baseband filter 122 providing the baseband signal 210 and the common-mode voltage 214 to the mixer 124 (e.g., in an up-conversion mode) or the baseband filter 122 obtaining the baseband signal 210 and the common-mode voltage 214 from the mixer 124 (e.g., in an down-conversion mode).

Operations of the baseband filter 122 are also associated with the common-mode voltage 214. The baseband filter 122, for example, generates a common-mode reference voltage 216 (VCM Ref 216) that tracks (e.g., follows) the common-mode voltage 214 associated with the baseband signal 210. The common-mode reference voltage 216 can be substantially the same as the common-mode voltage 214 or offset by a known amount. In some implementations, such as during transmission (e.g., for the up-conversion mode), the baseband filter 122 sets the common-mode voltage 214 based on the common-mode reference voltage 216. In other implementations, such as during reception (e.g., for the down-conversion mode), the baseband filter 122 sets the common-mode reference voltage 216 based on the common-mode voltage 214 provided by the mixer 124.

The bias circuit 126 is coupled to the baseband filter 122 and receives the common-mode reference voltage 216. Based on the common-mode reference voltage 216, the bias circuit 126 generates a DC voltage referred to as a bias voltage 218 for biasing the mixer transistor 208. Through the bias node 202, the bias voltage 218 can be applied to at least one terminal of the mixer transistor 208, such as a gate, a source, or a drain of a MOSFET via the bias node 202. In some implementations, the mixer transistor 208 has the gate coupled to the bias node 202, the source coupled to the baseband node 204, and the drain coupled to the radio-frequency node 206. In general, biasing sets an operational mode of the mixer transistor 208, such as biasing the mixer transistor 208 to operate in a saturation region, a triode region, or a cut-off region. Additionally, the bias voltage 218 can be empirically determined to enhance linearity and power efficiency of the mixer 124. To achieve this, the bias voltage 218 can depend on several factors, including a threshold voltage of the mixer transistor 208 and a voltage swing of a clock signal (e.g., the local oscillator signal 226) that can be applied to the gate of the mixer transistor 208.

Other components can be coupled between the mixer transistor 208 and the bias node 202, the baseband node 204, or the radio-frequency node 206. As an example, a resistor 228 can be coupled between the bias node 202 and the gate of the mixer transistor 208 to provide isolation between the bias circuit 126 and the mixer transistor 208. In some implementations, the bias voltage 218 is provided to the mixer transistor 208 along with other capacitively coupled signals. For example, a capacitor 230 can couple the gate of the mixer transistor 208 to the local oscillator 224 associated with the mixer 124.

In general, one of the challenges in biasing the mixer transistor 208 involves accounting for variations that can cause performance of the mixer transistor 208 to change and thereby change a desired bias voltage 218. Some variations are transient and vary over time, such as the use of different operational modes by the wireless transceiver 120. Other variations can be static and not vary significantly over time, such as process variations that cause inherent differences across different wireless transceivers 120.

The operational modes may include different power modes, such as a high-power mode and a low-power mode. The operational mode used by the wireless transceiver 120 may change based on a desired transmission range (e.g., a measured distance from the computing device 102 to the base station 104) or according to a power conservation program. Between the different operational modes, the common-mode voltage 214 associated with the baseband signal 210 and the common-mode reference voltage 216 may vary significantly, such as greater than or equal to approximately 100 millivolts (mV). As an example, the common-mode reference voltage 216 may be 900 mV for the high-power mode and 600 mV for the low-power mode. Having the bias voltage 218 dependent upon the common-mode reference voltage 216, for example, enables the bias voltage 218 to track variations in the common-mode voltage 214.

In addition to different power modes, the operational modes may also include different radio-frequency bands. The wireless transceiver 120, for example, may be able to utilize a low radio-frequency band, a middle radio-frequency band, or a high radio-frequency band. The different radio-frequency bands may be selected to reduce interference or to communicate with different devices. The selected radio-frequency band determines the frequency of the local oscillator 224 for enabling the mixer 124 to perform the frequency conversion. By switching between different radio-frequency bands, a duty cycle of the local oscillator 224 changes, which affects the biasing of the mixer transistor 208 for desired switching performance.

In addition to the operational modes, process variations can cause performance differences between different baseband filters 122 or mixers 124. As a result, the manufacturing of multiple baseband filters 122 or multiple mixers 124 and the integration of these components into different wireless transceivers 120 can cause different wireless transceivers 120 to exhibit different performance characteristics. Example process variations can cause physically different baseband filters 122 to produce different common-mode reference voltages 216 (e.g., higher or lower). Additionally, different mixer transistors 208 can exhibit different switching speeds (e.g., slower or faster) due to different process corners. As such, adjustments to the bias voltage 218 by the voltage tuner circuit 130 (e.g., of FIGS. 1 and 4) can account for (e.g., compensate for) these process variations, thereby enabling similar performances to be achieved across multiple wireless transceivers 120. The adjustments to the bias voltage 218 can also enhance switching performance for the mixer 124.

In some implementations, the bias circuit 126 references at least one bias control parameter 220 for tuning the bias voltage 218. The bias control parameter 220 can include multiple control bits that enable the bias circuit 126 to adjust the bias voltage 218 based on known variations. The controller 132, for example, can write the bias control parameter 220 to the register 222 upon startup or during operation of the wireless transceiver 120. In some implementations, the controller 132 is responsible for setting the operational mode of the wireless transceiver 120, and the controller 132 can therefore write the appropriate bias control parameter 220 based on the current operational mode. In other cases, the controller 132 may reference information stored in the computer-readable storage medium 110 for setting the bias control parameter 220, such as information associated with process variations.

Figure 3:
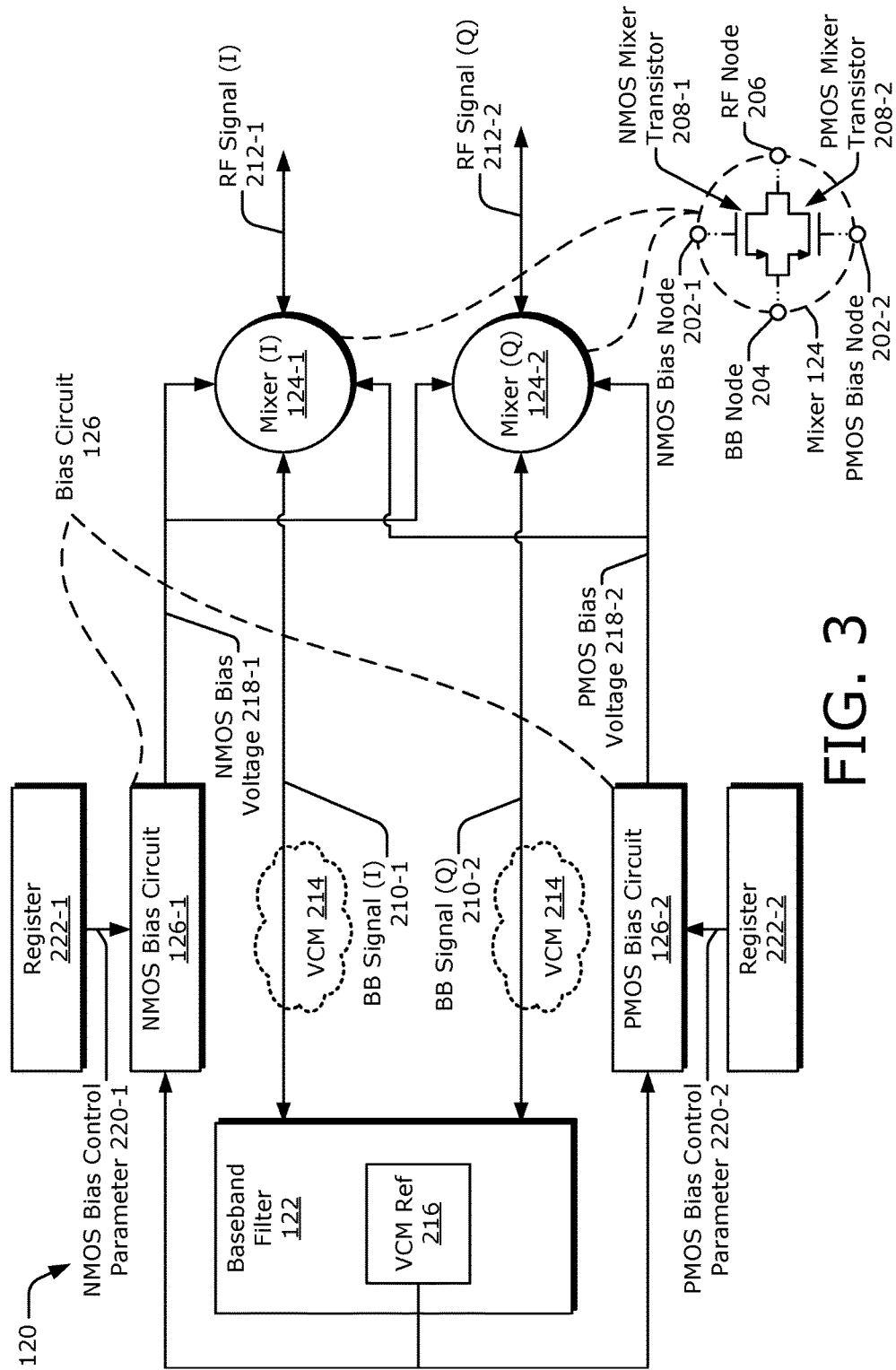
FIG. 3 illustrates an example multi-channel implementation of a wireless transceiver for mixer biasing with baseband filter common-mode voltage.

The techniques for mixer biasing using a baseband filter common-mode voltage can be applied to a variety of mixers 124, including passive mixers, active mixers, single-balanced mixers, double-balanced mixers, and so forth. These techniques can also be applied to multiple mixer stages that provide frequency conversion between the baseband frequency, one or more intermediate frequencies, and the radio frequency. The mixer 124 can also include multiple mixer transistors 208 coupled to the bias node 202 and biased by the bias circuit 126. As shown in FIG. 3, multiple bias circuits 126 may also be used to bias different mixer transistors 208 of a same mixer 124.

FIG. 3 illustrates an example multi-channel implementation of the wireless transceiver 120 for mixer biasing with baseband filter common-mode voltage. In the depicted configuration, the wireless transceiver 120 includes an in-phase channel and a quadrature channel for respectively processing real and imaginary signal components. For the in-phase channel, an in-phase mixer 124-1 upconverts an in-phase baseband signal 210-1 or downconverts an in-phase radio-frequency signal 212-1. Similarly, for the quadrature channel, a quadrature mixer 124-2 upconverts a quadrature baseband signal 210-2 or downconverts a quadrature radio-frequency signal 212-2.

In general, the mixer 124 can include different types of mixer transistors 208 that operate with different biasing. An example implementation of the in-phase mixer 124-1 or the quadrature mixer 124-2 is shown to include complementary switches comprising an n-channel metal-oxide-semiconductor (NMOS) field-effect mixer transistor 208-1 and a p-channel metal-oxide-semiconductor (PMOS) field-effect mixer transistor 208-2. In some implementations, the NMOS mixer transistor 208-1 and the PMOS mixer transistor 208-2 have sources coupled to the baseband node 204, drains coupled to the radio-frequency node 206, and gates respectively coupled to an NMOS bias node 202-1 and a PMOS bias node 202-2. To bias these different types of mixer transistors 208, the wireless transceiver 120 can include multiple bias circuits 126, such as an NMOS bias circuit 126-1 and a PMOS bias circuit 126-2.

The NMOS bias circuit 126-1 is coupled to the baseband filter 122 and the NMOS bias node 202-1 of the mixer 124. The NMOS bias circuit 126-1 receives the common-mode reference voltage 216 that is associated with the common-mode voltage 214. Based on the common-mode reference voltage 216, the NMOS bias circuit 126-1 generates an NMOS bias voltage 218-1 at the NMOS bias node 202-1. Via the NMOS bias node 202-1, the NMOS bias circuit 126-1 biases one or more NMOS mixer transistors 208-1. Likewise, the PMOS bias circuit 126-2 is coupled to the baseband filter 122 and the PMOS bias node 202-2 of the mixer 124. The PMOS bias circuit 126-2 also receives the common-mode reference voltage 216 and generates a PMOS bias voltage 218-2 that is based on the common-mode reference voltage 216. Via the PMOS bias node 202-2, the PMOS bias circuit 126-2 biases one or more PMOS mixer transistors 208-2 of the mixer 124.

The controller 132 (of FIGS. 1 and 2) can write an NMOS bias control parameter 220-1 to a first register 222-1 and a PMOS bias control parameter 220-2 to a second register 222-2. The NMOS bias circuit 126-1 and the PMOS bias circuit 126-2 can respectively reference the first register 222-1 and the second register 222-2 for tuning the bias voltages 218. In some implementations, a same register 222 and a same bias control parameter 220 can be used by the NMOS bias circuit 126-1 and the PMOS bias circuit 126-2. The NMOS bias circuit 126-1 or the PMOS bias circuit 126-2 can be implemented using the voltage tracker circuit 128 and the voltage tuner circuit 130, as shown in FIG. 4.

Figure 4:
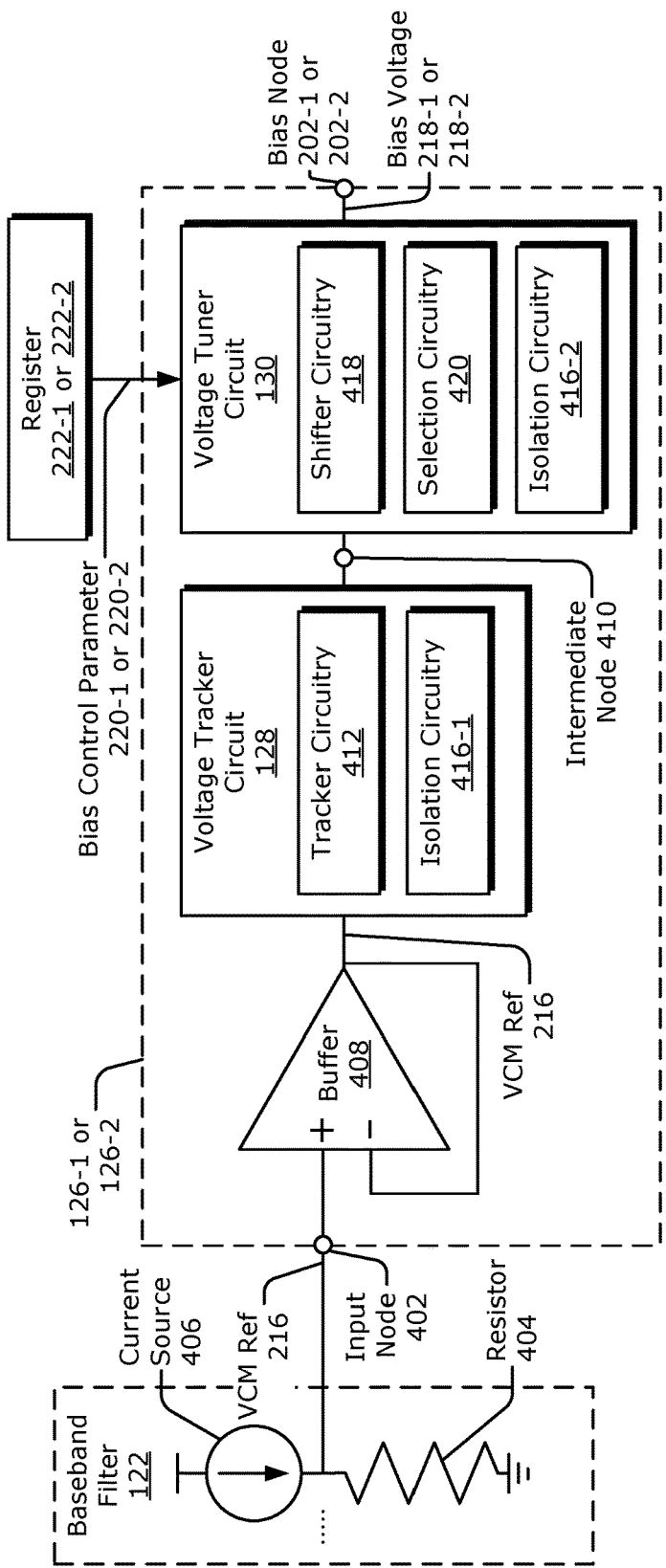
FIG. 4 illustrates an example implementation of a bias circuit for mixer biasing with baseband filter common-mode voltage.

FIG. 4 illustrates an example implementation of the bias circuit 126 for mixer biasing with baseband filter common-mode voltage. The depicted configuration can implement the NMOS bias circuit 126-1 or the PMOS bias circuit 126-2 for respectively generating the NMOS bias voltage 218-1 or the PMOS bias voltage 218-2 at the NMOS bias node 202-1 or the PMOS bias node 202-2. The bias circuit 126 includes an input node 402 that is coupled to the baseband filter 122. At the input node 402, the common-mode reference voltage 216 is received. As shown in FIG. 4, the common-mode reference voltage 216 can be generated by the baseband filter 122 using a resistor 404 and a current source 406.

The bias circuit 126 can optionally include a buffer 408 coupled to the input node 402. As an example, the buffer 408 can be implemented using an operational amplifier in unity-gain configuration. The buffer provides isolation between the baseband filter 122 and portions of the bias circuit 126. In this way, current does not substantially flow between the baseband filter 122 and the other portions of the bias circuit 126, such as the voltage tracker circuit 128 or the voltage tuner circuit 130. Although not depicted, the bias circuit 126 can be implemented without the buffer 408.

The bias circuit 126 includes the voltage tracker circuit 128 coupled between the input node 402 and an intermediate node 410. In general, the voltage tracker circuit 128 causes the bias voltage 218 to track (e.g., follow) different voltage variations that affect the biasing of the mixer transistor 208. The voltage tracker circuit 128 includes tracker circuitry 412 and first isolation circuitry 416-1.

Figure 5:
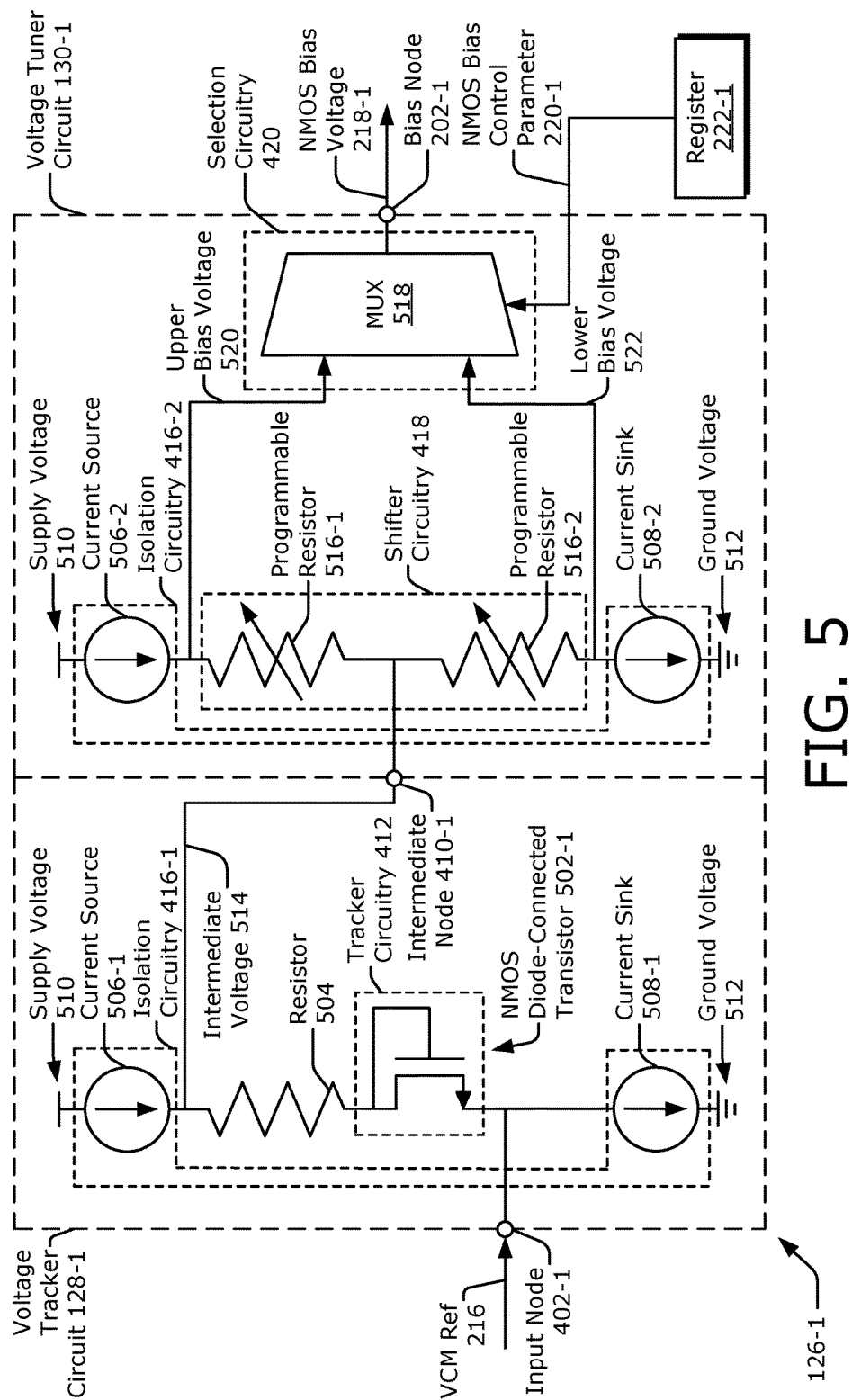
FIG. 5 illustrates an example implementation of an n-channel metal-oxide-semiconductor field-effect transistor (MOSFET) bias circuit for mixer biasing with baseband filter common-mode voltage.
Figure 6:
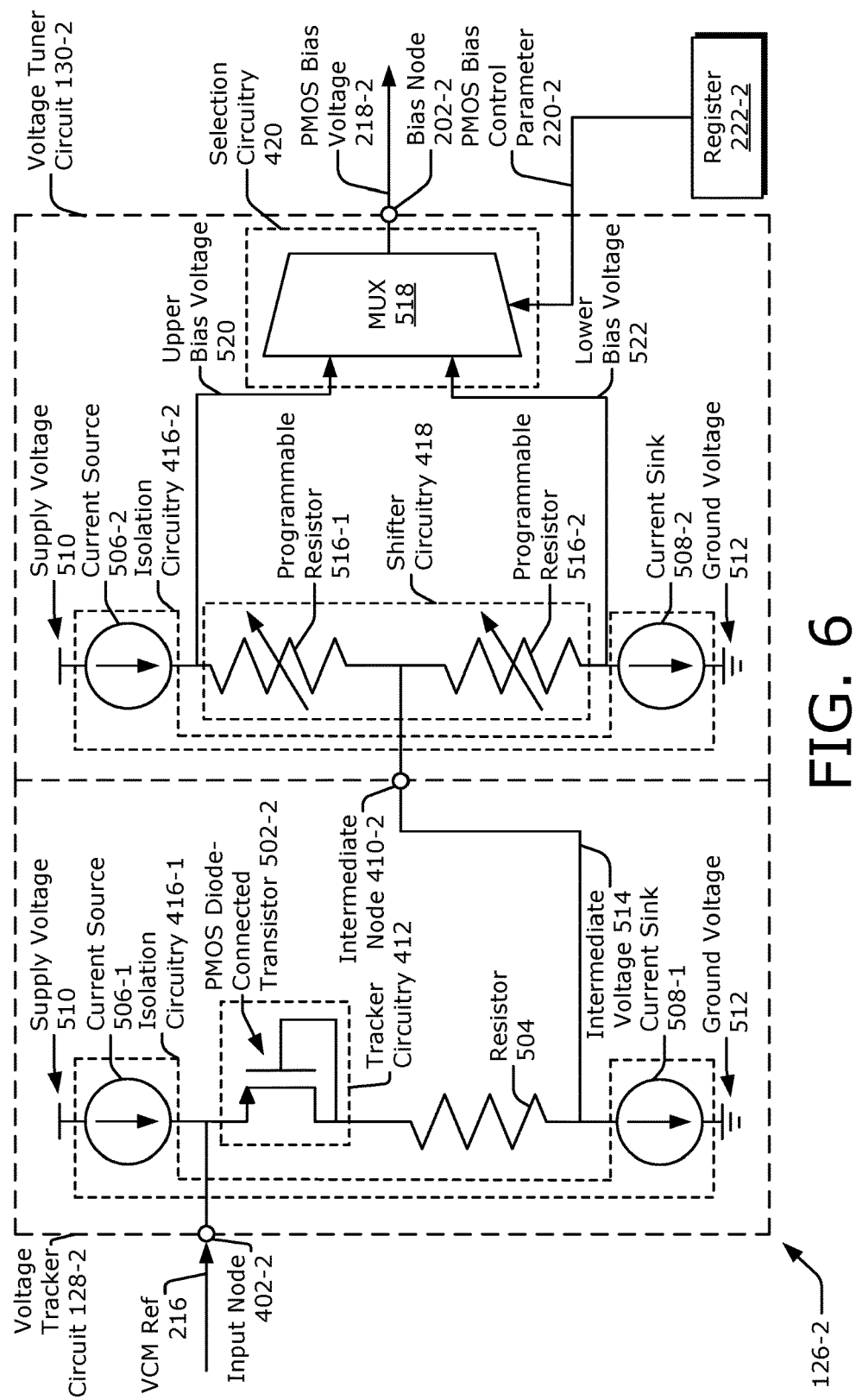
FIG. 6 illustrates an example implementation of a p-channel MOSFET bias circuit for mixer biasing with baseband filter common-mode voltage.

The tracker circuitry 412 enables the bias voltage 218 to track the common-mode reference voltage 216. In addition to causing the bias voltage 218 to be dependent upon the common-mode reference voltage 216, the tracker circuitry 412 causes the bias voltage 218 to be substantially independent of a supply voltage and a ground voltage. The tracker circuitry 412 also enables the bias voltage 218 to track variations in a threshold voltage that is associated with the mixer transistor 208. As the threshold voltage can change due to temperature variations and affect biasing of the mixer transistor 208, the tracker circuitry 412 can generate the bias voltage 218 to account for these variations. In general, the tracker circuitry 412 includes a transistor that has similar characteristics to the mixer transistor 208 such that a threshold voltage of the transistor varies similarly to the threshold voltage of the mixer transistor 208. As shown in FIGS. 5 and 6, the transistor of the tracker circuitry 412 can be used to generate the bias voltage 218 such that the bias voltage 218 tracks the common-mode reference voltage 216 and the threshold voltage of the mixer transistor 208.

The first isolation circuitry 416-1 isolates the voltage tracker circuit 128 from the buffer 408 or the baseband filter 122 and from the voltage tuner circuit 130. The first isolation circuitry 416-1 substantially prevents current from leaking outside of the voltage tracker circuit 128 and affecting the voltage at the input node 402 or the intermediate node 410. This ensures that the voltage tracker circuit 128 does not substantially impact the baseband filter 122 or the voltage tuner circuit 130. In general, the first isolation circuitry 416-1 can include matched current sources and current sinks that cause a current to flow from a supply voltage, across the tracker circuitry 412, and to a ground voltage.

The bias circuit 126 also includes the voltage tuner circuit 130 coupled between the intermediate node 410 and the bias node 202. Generally, the voltage tuner circuit 130 tunes an intermediate voltage generated by the voltage tracker circuit 128 at the intermediate node 410 for biasing the mixer transistor 208 at the bias node 202. This is desirable because, in some cases, the intermediate voltage may not be a sufficiently-precise voltage for biasing the mixer transistor 208 to a specified level. Additionally, different process, voltage, and temperature (PVT) variations can affect the desired biasing. To account for such variations, the voltage tuner circuit 130 shifts the intermediate voltage at the intermediate node 410 to generate a bias voltage 218 that achieves the desired biasing. The voltage tuner circuit 130 can also account for offsets (if any) between the common-mode reference voltage 216 and the common-mode voltage 214. The voltage tuner circuit 130 can be implemented using, for example, a DC level shifter. In general, the voltage tuner circuit 130 includes shifter circuitry 418, selection circuitry 420, and second isolation circuitry 416-2.

In operation, the shifter circuitry 418 shifts the intermediate voltage at the intermediate node 410 to generate the bias voltage 218. Depending on the implementation, the shifter circuitry 418 can shift the voltage up or down. In some implementations, the shifter circuitry 418 can produce multiple shifted voltages for selection as the bias voltage 218. The shifter circuitry 418 can be programmable, enabling an amount of voltage shift to be controlled by the controller 132 via the bias control parameter 220-1 or 220-2. As an example, the shifter circuitry 418 can shift the bias voltage from −200 mV to 200 mV, in steps of 10 mV. The shifter circuitry 418 can be implemented using, for example, resistors, digitally-programmable potentiometers, a bank of resistors and switches and so forth. In general, any type of voltage divider can be used to produce the voltage shift.

In cases where there are multiple shifted voltages available via the shifter circuitry 418, the selection circuitry 420 selects one of the multiple shifted voltages for biasing the mixer transistor 208. The selection circuitry 420 can be implemented using a multiplexer that can perform the selection based on the bias control parameter 220. The first register 222-1 or the second register 222-2 can store the bias control parameter 220 as a set of bits. A portion of the bits may be used to specify which shifted voltage the selection circuitry 420 selects, and the other portion of the bits may be used to specify an amount of voltage shift the shifter circuitry 418 produces (e.g., by specifying resistance values for programmable resistors).

The voltage tuner circuit 130 also includes the second isolation circuitry 416-2. Similar to the first isolation circuitry 416-1, the second isolation circuitry 416-2 substantially prevents current from leaking outside the voltage tuner circuit 130, thereby ensuring the voltage tuner circuit 130 does not substantially impact the voltage tracker circuit 128 or the mixer 124.

Although described with respect to the common-mode reference voltage 216, the bias circuit 126 can also be used for implementing biasing with other common-mode reference voltages. By applying these other common-mode reference voltages to the input node 402, the bias circuit 126 can cause the bias voltage 218 to track these other common-mode reference voltages. This also provides many advantages, including causing the bias voltage 218 to be substantially independent of variations in supply voltages and ground voltages, as well as tuning the bias voltage 218 based on other known variations.

FIG. 5 illustrates an example implementation of the NMOS bias circuit 126-1 for mixer biasing with baseband filter common-mode voltage. In the depicted example, a first voltage tracker circuit 128-1 is implemented using an NMOS diode-connected transistor 502-1, a resistor 504, a first current source 506-1, and a first current sink 508-1. The NMOS diode-connected transistor 502-1 has a source coupled to a first input node 402-1 and a gate coupled to a drain. The voltage produced at the drain of the NMOS diode-connected transistor 502-1 is approximately equal to a summation of the common-mode reference voltage 216 and a threshold voltage of the NMOS diode-connected transistor 502-1. In this way, the NMOS diode-connected transistor 502-1 at least partially implements the tracker circuitry 412 of FIG. 4. The gate and the drain of the NMOS diode-connected transistor 502-1 are also coupled to a resistor 504. The resistor 504 generates an appropriate temperature related slope-controlled current for biasing the NMOS diode-connected transistor 502-1.

The first current source 506-1 is coupled between a supply voltage 510 and the resistor 504, and the first current sink 508-1 is coupled between ground voltage 512 and the source of the NMOS diode-connected transistor 502-1. The first current source 506-1 and the first current sink 508-1 can be implemented using, for example, proportional to absolute temperature (PTAT) or complementary to absolute temperature (CTAT) untrimmed current sources. In general, the first current source 506-1 and the first current sink 508-1 are approximately matched such that a substantial portion of the current generated by the first current source 506-1 flows through the NMOS diode-connected transistor 502-1 to the ground voltage 512. Thus, the first input node 402-1 and a first intermediate node 410-1 are voltage connections, and little to no current flows between the first voltage tracker circuit 128-1 and the baseband filter 122, or between the first voltage tracker circuit 128-1 and a first voltage tuner circuit 130-1. The first current source 506-1 and the first current sink 508-1 at least partially implement the first isolation circuitry 416-1.

The first voltage tracker circuit 128-1 generates an intermediate voltage 514 at the first intermediate node 410-1 that is approximately equal to a summation of the common-mode reference voltage 216, the threshold voltage of the NMOS diode-connected transistor 502-1, and a voltage difference across the resistor 504. By having the NMOS diode-connected transistor 502-1 coupled between the first current source 506-1 and the first current sink 508-1 and not coupled directly to the supply voltage 510 or the ground voltage 512, the intermediate voltage 514 is substantially independent of the supply voltage 510 and the ground voltage 512. In this way, variations in the supply voltage 510 and the ground voltage 512 are effectively insignificant and do not substantially affect the NMOS bias voltage 218-1.

In some cases, the intermediate voltage 514 is higher or lower than desired for biasing the mixer transistor 208. Thus, the first voltage tuner circuit 130-1 can further tune the intermediate voltage 514. In the depicted configuration, the first voltage tuner circuit 130-1 includes a first programmable resistor 516-1, a second programmable resistor 516-2, a second current source 506-2, a second current sink 508-2, and a multiplexer 518 (MUX 518).

The first programmable resistor 516-1 is coupled between the supply voltage 510 and the first intermediate node 410-1, and the second programmable resistor 516-1 is coupled between the first intermediate node 410-1 and the ground voltage 512. The first programmable resistor 516-1 and the second programmable resistor 516-2 respectively shift the intermediate voltage 514 up or down, thereby generating an upper bias voltage 520 and a lower bias voltage 522. The first programmable resistor 516-1 and the second programmable resistor 516-2 at least partially implement the shifter circuitry 418.

The second current source 506-2 is coupled between the supply voltage 510 and the first programmable resistor 516-1, and the second current sink 508-2 is coupled between the second programmable resistor 516-2 and the ground voltage 512. The second current source 506-2 and the second current sink 508-2 can be implemented using, for example, band-gap untrimmed current sources, which provide substantially constant current over varying temperatures. The second current source 506-2 and the second current sink 508-2 can be untrimmed to adjust the current for process variations in the first programmable resistor 516-1 and the second programmable resistor 516-2. The second current source 506-2 and the second current sink 508-2 at least partially implement the second isolation circuitry 416-2.

An output of the multiplexer 518 is coupled to the bias node 202-1. First and second inputs of the multiplexer 518 respectively receive the upper bias voltage 520 and the lower bias voltage 522. The multiplexer 518 selects the upper bias voltage 520 or the lower bias voltage 522 and provides the selected bias voltage to the bias node 202-1 as the NMOS bias voltage 218-1. Although two voltage options are shown, any number of shifted voltages can be provided to the multiplexer 518 for selection using any number of programmable resistors 516 (e.g., one, three, four, and so forth). The multiplexer 518 at least partially implements the selection circuitry 420.

Both a resistance of the programmable resistors 516 and the selection of the multiplexer 518 can be set according to the NMOS bias control parameter 220-1 provided via the first register 222-1. The resistance of the programmable resistors 516, for example, can be set to account for process variations. As another example, the multiplexer 518 can select the upper bias voltage 520 or the lower bias voltage 522 depending on the power mode. Both the resistance and the selection can also be set to account for different duty cycles of the local oscillator 224 associated with the mixer 124. A look-up table can also be used to provide the desired combination of the resistance and voltage selection.

FIG. 6 illustrates an example implementation of the PMOS bias circuit 126-2 for mixer biasing with baseband filter common-mode voltage. The PMOS bias circuit 126-2 includes a second voltage tracker circuit 128-2 and a second voltage tuner circuit 130-2. The second voltage tracker circuit 128-2 is coupled between a second input node 402-2 and a second intermediate node 410-2. The second voltage tuner circuit 130-2 is coupled between the second intermediate node 410-2 and the PMOS bias node 202-2. The components and functionality of the PMOS bias circuit 126-2 are substantially the same as, or analogous to, those of the NMOS bias circuit 126-1, as described with reference to FIG. 5.

The PMOS bias circuit 126-2, however, has a PMOS diode-connected transistor 502-2 instead of an NMOS diode-connected transistor 502-1. The PMOS diode-connected transistor 502-2 has a source coupled to the second input node 402-2. A gate and a drain of the PMOS diode-connected transistor 502-2 are connected to the resistor 504. Similar to the NMOS bias circuit 126-1, the PMOS diode-connected transistor 502-2 and the resistor 504 are coupled in series between the second intermediate node 410-2 and the input node 402-2. The second intermediate node 410-2 of the PMOS bias circuit 126-2, however, is between the current sink 508-1 and the resistor 504 instead of between the current source 506-1 and the resistor 504, as in the NMOS bias circuit 126-1. As a result, the intermediate voltage 514 at the second intermediate node 410-2 is equal to a subtraction of a threshold voltage of the PMOS diode-connected transistor 502-2 and a voltage difference across the resistor 504 from the common-mode reference voltage 216.

FIG. 7 illustrates a flow diagram illustrating an example process 700 for mixer biasing with baseband filter common-mode voltage. The process 700 is described in the form of a set of blocks 702-706 that specify operations that can be performed. However, operations are not necessarily limited to the order shown in FIG. 7 or described herein, for the operations may be implemented in alternative orders or in fully or partially overlapping manners. Operations represented by the illustrated blocks of the process 700 may be performed by a computing device 102 (e.g., of FIG. 1) or a wireless transceiver 120 (e.g., of FIGS. 1-3). More specifically, the operations of the process 700 may be performed by a bias circuit 126 as shown in FIGS. 4-6.

At block 702, a common-mode voltage that is associated with a baseband signal is communicated between a baseband filter and a mixer via a baseband node. For example, the common-mode voltage 214 can be generated by the baseband filter 122 to the mixer 124 during transmission. During reception, the common-mode voltage 214 can be received by the baseband filter 122 from the mixer 124. The baseband filter 122 and the mixer 124 communicate the common-mode voltage 214 and the baseband signal 210 via the baseband node 204. Additionally, the mixer 124 includes a mixer transistor 208 that is coupled to the baseband node 204. As such, variations of the common-mode voltage 214 can affect the biasing of the mixer transistor 208.

At block 704, a bias voltage is generated based on the common-mode voltage. For example, the baseband filter 122 provides the common-mode reference voltage 216 to the bias circuit 126. The common-mode reference voltage 216 tracks or follows the common-mode voltage 214 and can be approximately equal to the common-mode voltage 214 or differ by a known offset. In some cases, the common-mode reference voltage 216 is used by the baseband filter 122 to generate the common-mode voltage 214. The bias circuit 126 includes the voltage tracker circuit 128 that generates the intermediate voltage 514 based on the common-mode reference voltage 216. The bias circuit 126 also includes the voltage tuner circuit 130 to further tune the intermediate voltage 514 to produce the bias voltage 218 based on variations caused by different operational modes or process variations. For example, the bias voltage 218 can be tuned to account for a switching speed of the mixer transistor 208, a duty cycle of the local oscillator 224 associated with the mixer 124, or a power mode associated with an operation of the wireless transceiver 120.

At block 706, the mixer transistor is biased using the bias voltage that is based on the common-mode voltage. For example, the bias voltage 218 is applied to a bias node 202 of the mixer 124. In some implementations, the mixer transistor 208 has a gate coupled to the bias node 202. The bias voltage 218 provides a desired biasing of the mixer transistor 208 based on the common-mode voltage 214 and other variations due to process, voltage, or temperature. In this way, application of the bias voltage 218 reduces harmonic distortion and conversion loss in the mixer 124.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   a mixer having a mixer transistor, a bias node, and a baseband node, the mixer transistor coupled to the bias node and the baseband node;
   a baseband filter coupled to the mixer via the baseband node, the baseband filter configured to operate with a common-mode reference voltage that is associated with a common-mode voltage applied at the baseband node; and
   a bias circuit coupled to the baseband filter and the bias node, the bias circuit configured to:
      receive the common-mode reference voltage from the baseband filter; and
      generate, at the bias node, a bias voltage for biasing the mixer transistor based on the common-mode reference voltage.

2. The apparatus of claim 1, wherein:
   the bias circuit includes a diode-connected transistor having a source, a gate, and a drain, the source coupled to the baseband filter, the gate coupled to the drain; and
   the diode-connected transistor is configured to generate a voltage at the drain based on the common-mode reference voltage and a threshold voltage of the diode-connected transistor.

3. The apparatus of claim 2, wherein:
   the bias circuit includes:
      a current source coupled to a supply voltage; and
      a current sink coupled to a ground voltage; and
   the diode-connected transistor is coupled between the current source and the current sink.

4. The apparatus of claim 3, wherein the current source and the current sink are configured to:
   isolate the bias circuit from the baseband filter by causing a substantial portion of a current generated by the current source to flow through the diode-connected transistor to the ground voltage; and
   enable the bias voltage to be substantially independent of the supply voltage and the ground voltage.

5. The apparatus of claim 4, wherein the bias circuit includes a resistor coupled between the drain of the diode-connected transistor and an intermediate node, the resistor configured to generate an intermediate voltage at the intermediate node based on the common-mode reference voltage, the threshold voltage of the diode-connected transistor, the current generated by the current source, and a resistance of the resistor.

6. The apparatus of claim 5, wherein the bias circuit includes a programmable resistor coupled to the intermediate node, the programmable resistor configured to shift the intermediate voltage at the intermediate node.

7. The apparatus of claim 6, wherein:
   the programmable resistor is configured to shift the voltage at the intermediate node up to produce an upper bias voltage;
   the bias circuit includes:
      another programmable resistor coupled to the intermediate node, the other programmable resistor configured to shift the voltage at the intermediate node down to produce a lower bias voltage; and
      a multiplexer configured to select the upper bias voltage or the lower bias voltage as the bias voltage.

8. The apparatus of claim 7, wherein the multiplexer is configured to select the upper bias voltage or the lower bias voltage based on at least one of the following:
   a power mode;
   a radio-frequency band; or
   a switching speed of the mixer transistor.

9. The apparatus of claim 3, wherein:
   the diode-connected transistor comprises a p-channel metal-oxide-semiconductor field-effect transistor (MOSFET); and
   the mixer transistor is another p-channel MOSFET having a gate coupled to the bias node and a source coupled to the baseband node.

10. The apparatus of claim 3, wherein:
    the diode-connected transistor comprises an n-channel metal-oxide-semiconductor field-effect transistor (MOSFET); and the mixer transistor is another n-channel MOSFET having another gate coupled to the bias node and another source coupled to the baseband node.

11. The apparatus of claim 1, wherein the common-mode reference voltage is approximately equal to the common-mode voltage applied at the baseband node.

12. The apparatus of claim 1, wherein:
the baseband filter is configured to provide a baseband signal to the mixer via the baseband node, the baseband signal associated with the common-mode voltage; and
the mixer is configured to upconvert the baseband signal to a radio-frequency signal.

13. The apparatus of claim 1, wherein:
the mixer is configured to downconvert a radio-frequency signal to a baseband signal, the baseband signal associated with the common-mode voltage; and
the baseband filter is configured to receive the baseband signal via the baseband node.

14. An apparatus comprising:
a mixer having a mixer transistor, a bias node, and a baseband node, the mixer transistor coupled to the bias node and the baseband node;
a baseband filter coupled to the mixer via the baseband node, the baseband filter configured to operate with a common-mode reference voltage that is associated with a common-mode voltage applied at the baseband node; and
means for generating a bias voltage for biasing the mixer transistor based on the common-mode reference voltage, the means for generating coupled to the baseband filter and the bias node, the means for generating configured to provide the bias voltage to the bias node.

15. The apparatus of claim 14, wherein the means for generating the bias voltage is configured to cause the bias voltage to be substantially independent of a supply voltage and a ground voltage.

16. The apparatus of claim 14, wherein the means for generating the bias voltage is configured to cause the bias voltage to be dependent upon a threshold voltage that corresponds to another threshold voltage of the mixer transistor.

17. The apparatus of claim 14, wherein:
the means for generating comprises means for tracking the common-mode reference voltage to produce an intermediate voltage; and
the means for generating is configured to provide the bias voltage based on the intermediate voltage.

18. The apparatus of claim 14, wherein:
the means for generating comprises means for tuning an intermediate voltage that is based on the common-mode reference voltage; and
the means for generating is configured to provide the bias voltage based on the intermediate voltage.

19. A method for mixer biasing with a baseband filter common-mode voltage, the method comprising:
communicating a common-mode voltage between a baseband filter and a mixer via a baseband node, the common-mode voltage associated with a baseband signal, the mixer including a mixer transistor coupled to the baseband node;
generating a bias voltage based on the common-mode voltage; and
biasing the mixer transistor using the bias voltage that is based on the common-mode voltage.

20. The method of claim 19, wherein
the mixer transistor has a source coupled to the baseband node; and
the biasing of the mixer transistor comprises applying the bias voltage to a gate of the mixer transistor.

21. The method of claim 19, wherein the generating of the bias voltage comprises causing the bias voltage to be substantially independent of supply voltage variations and ground voltage variations.

22. The method of claim 19, wherein the generating further comprises tuning the bias voltage to account for a switching speed of the mixer transistor.

23. The method of claim 19, wherein the generating further comprises tuning the bias voltage to account for an operational power mode.

24. The method of claim 19, wherein the generating further comprises tuning the bias voltage to account for a duty cycle of a local oscillator associated with the mixer.

* * * * *